(12) United States Patent
Peters et al.

(10) Patent No.: US 7,457,341 B2
(45) Date of Patent: Nov. 25, 2008

(54) LOW LOSS GRATING FOR HIGH EFFICIENCY WAVELENGTH STABILIZED HIGH POWER LASERS

(75) Inventors: Matthew Glenn Peters, Menlo Park, CA (US); Hanmin Zhao, Fremont, CA (US)

(73) Assignee: JDS Uniphase Corporation, Milpitas, CA (US)

( * ) Notice: Subject to any disclaimer, the term of this patent is extended or adjusted under 35 U.S.C. 154(b) by 38 days.

(21) Appl. No.: 11/360,752

(22) Filed: Feb. 23, 2006

(65) Prior Publication Data

US 2006/0187995 A1    Aug. 24, 2006

Related U.S. Application Data

(60) Provisional application No. 60/655,781, filed on Feb. 24, 2005.

(51) Int. Cl.
    *H01S 3/08*    (2006.01)
(52) U.S. Cl. ..................... 372/96; 372/46.01
(58) Field of Classification Search ............. 372/45.01, 372/43.01, 50.1, 107; 359/344
See application file for complete search history.

(56) References Cited

U.S. PATENT DOCUMENTS

| | | | |
|---|---|---|---|
| 4,984,242 A | 1/1991 | Scifres et al. ........... 372/45.011 |
| 5,185,754 A | 2/1993 | Craig et al. ............... 372/45.01 |
| 5,568,505 A | 10/1996 | Okuda et al. .................. 372/96 |
| 5,602,866 A | 2/1997 | Fukunaga .................... 372/96 |
| 5,642,371 A * | 6/1997 | Tohyama et al. ......... 372/45.01 |
| 6,195,381 B1 | 2/2001 | Botez et al. ..................... 372/96 |
| 6,363,092 B1 | 3/2002 | Botez et al. ............... 372/43.01 |
| 6,445,724 B2 * | 9/2002 | Abeles ................... 372/50.124 |
| 6,577,660 B1 | 6/2003 | Muroya ................... 372/50.11 |
| 6,678,302 B2 | 1/2004 | Nakamura ................. 372/50.1 |
| 6,798,798 B2 * | 9/2004 | Yoshida et al. ......... 372/29.021 |
| 6,829,285 B2 * | 12/2004 | Yoshida et al. .............. 372/102 |
| 6,839,377 B2 | 1/2005 | Bacher ....................... 372/102 |
| 6,888,874 B2 * | 5/2005 | Masood et al. ................. 372/96 |
| 2003/0053502 A1* | 3/2003 | Wakisaka et al. ............. 372/45 |

FOREIGN PATENT DOCUMENTS

| | | |
|---|---|---|
| EP | 1 202 407 | 5/2002 |
| EP | 1 255 336 | 11/2002 |

* cited by examiner

*Primary Examiner*—Minsun Harvey
*Assistant Examiner*—Tuan N. Nguyen
(74) *Attorney, Agent, or Firm*—Allen, Dyer, Doppelt, Milbrath & Gilchrist, P.A.

(57) ABSTRACT

A low optical loss and high efficiency grating is placed within a broad-area high-power laser diode or single spatial mode laser diode to narrow the spectral width and stabilize the emission wavelength. Several embodiments of grating configurations are presented, together with the measured results of a reduction to practice of a particular embodiment.

10 Claims, 19 Drawing Sheets

LOW LOSS GRATING FOR HIGH EFFICIENCY WAVELENGTH STABILIZED HIGH POWER LASERS

CROSS REFERENCE TO A RELATED APPLICATION

This applications claims priority of U.S. Provisional Patent Application No. 60/655,781 filed on Feb. 24, 2005, entitled "Low Loss Grating for High Efficiency Wavelength Stabilized High Power Lasers" which is incorporated herein by reference for all purposes.

FIELD OF THE INVENTION

This invention relates to a broad area high-power semiconductor laser diode, which has a low-loss grating having a low total coupling coefficient placed within its resonant cavity, whereby the spectral width of laser emission is made narrower and the wavelength of the radiation emitted by the diode is stabilized.

BACKGROUND OF THE INVENTION

High power broad area and single spatial mode semiconductor lasers are used in a variety of applications that require some stability of the wavelength over a range of a few nanometers. Examples include broad area laser pumping of solid-state crystals such as Nd:YAG which requires a pump wavelength of about 808±3 nm, broad area laser pumping of ytterbium doped fiber amplifiers and lasers which require pump wavelengths of about 970±1 nm, or single spatial mode laser pumping of erbium doped fiber amplifiers (EDFA) which requires a pump wavelength of about 975±0.5 nm.

Note that with this type of pump source there is no need for single frequency operation. Multiple longitudinal laser modes within a few nanometer wide envelope is acceptable or in some cases even desirable.

Another problem is that changes in temperature, laser drive current and power or optical feedback can shift the laser diode wavelength out of the specified range.

One common method to control the wavelength is to use a periodic grating, such as in distributed Bragg reflector (DBR) or distributed feedback Bragg (DFB) lasers. However most work on gratings has been to achieve single frequency operation for relatively low power lasers.

For instance, Kagawa et al. (U.S. Pat. No. 4,984,242) disclose an aluminum gallium arsenide (AlGaAs) semiconductor gain-coupled DFB laser which operates in single longitudinal mode. The lateral grating, which modulates the width of the current injected region, extends over the whole length of the laser, as illustrated in FIG. 1b.

On the other hand, Okuda et al. (U.S. Pat. No. 5,568,505) disclose a similar device in the indium gallium arsenide phosphide (InGaAsP) material system emitting at a wavelength of 1310 nm. In order to optimize their laser structure for analog modulation performance, which requires very linear single mode performance characteristics (low $3^{rd}$ harmonic intermodulation distortion), they implement a grating with a coupling coefficient by cavity length product between 0.4 and 1.0 in value. The grating in some of the embodiments they present can be partial, i.e. occupying only a portion of the cavity length and may incorporate a quarter-wave shifted grating. Their device is optimised to relatively low optical output powers, below about 10 mW.

Another example is a wavelength stabilized single mode laser in the aluminum indium gallium arsenide phosphide (AlInGaAsP) material system as disclosed by Fukunaga (U.S. Pat. No. 5,602,866). They describe a photonic integrated circuit with three sections on a single waveguide incorporating a DBR laser, a modulator and an amplifier. Their approach is to generate a single mode lasing frequency at relatively low power, modulate it with a signal and then optically amplify it for high power output. However, they are silent on some key parameters, which are essential for high power pumping operation, such as, suitable values for front and rear facet reflectivity, cavity length, and product of coupling coefficient-cavity length.

Botez et al. (U.S. Pat. Nos. 6,195,381 and 6,363,092) teach a broad-area DFB laser for optical pumping applications. However, since the grating extends for the total length of the lasing cavity, practical limitations exist to keeping the coupling coefficient to adequately low values. As their used cavity length is longer than 1.0 mm, Botez et al. recommend a coupling coefficient—length product of about unity. As is known in the art, DFB can lase in one of two modes, depending on the coupling coefficient value. Avoiding this ambiguity can restrict the coupling coefficient values.

Muroya (U.S. Pat. No. 6,577,660) describes a laser diode based on the InGaAsP material system. This system is known to possess intrinsic electronic mechanisms, which differ fundamentally from those of the AlGaAs system, so they must be optimised in a totally different way to achieve high output optical power. For this reason, Muroya describes a relatively short DFB structure, about 300 micron in length and incorporating a quarter-wave shifted grating which is advantageous for, among other things, reducing the internal peak power density. The technology for fabricating such a grating is rather more complex. The emission wavelengths achievable in this system are also not suitable for the pumping applications which are a major aspect of this disclosure.

Nakamura (U.S. Pat. No. 6,678,302) employs the same material system as Muroya, but focuses on integrating the laser diode with a modulator. However, he does not specify suitable values for the product of coupling coefficient and cavity length.

This invention addresses the above problems by implementing a low-loss intra-cavity grating while achieving moderate wavelength stability of a broad-area or single spatial mode laser diode without adversely affecting the laser diode efficiency or maximum optical power.

SUMMARY OF THE INVENTION

It is an object of the present invention to stabilize an emission wavelength of a broad area semiconductor laser operating at high output power levels by using an intra-cavity grating.

A further object of the present invention is to stabilize the emission wavelength without incurring excessive optical loss in the laser cavity to enable efficient operation at high output power levels. A grating with a low total coupling is implemented to achieve essentially the same optical loss and efficiency as in similar structures without a grating.

The low total coupling can be accomplished in the laser by a variety of methods, including:

a) incorporating the grating some distance above or below an active layer of a laser cavity where lasing mode intensity is low;
b) making the grating shorter than the laser cavity;
c) making the grating layer very thin;
d) segmenting the grating laterally or axially; and
e) making the grating with a small index variation.

In addition, a first-order grating is preferably used for lowest optical loss, although second-order gratings could also be applied. Four distinct embodiments of grating and facet reflectivity configurations include:
  i) a distributed feedback (DFB) grating structure extending over the full laser cavity length;
  ii) a front facet distributed Bragg reflector (DBR) or partial DFB structure with low anti-reflection (AR) coating;
  iii) a rear facet DBR or partial DFB with AR coating; and
  iv) a rear facet DBR or partial DFB with high reflectivity (HR) coating.

Yet another object of the present invention is to use a grating at a front facet or rear facet of the laser to increase the catastrophic optical damage (COD) threshold power by moving some of the optical field away from the facet.

The last object of the present invention (above) is included in accordance with Section (v) of the Provisional Application No. 60/655,781, which has been incorporated in instant application by reference.

A key aspect of this invention is the application of a low loss grating with low total coupling coefficient to stabilize wavelength rather than trying to make a single-frequency laser which could introduce excess optical loss and possibly cause undesirable mode hops.

BRIEF DESCRIPTION OF THE DRAWINGS

Exemplary embodiments of the invention will now be described in conjunction with the drawings.

Top views of possible low loss wavelength stabilized grating structures are illustrated in FIGS. 1a through 1f.

FIG. 2c is a scanning electron microscope view of the cross-section of a first-order 935 nm grating executed in the AlGaAs system as a working example. The invention, however, is not limited to AlGaAs, nor gratings of first-order, nor an emission wavelength of 935 nm.

Figure 7:
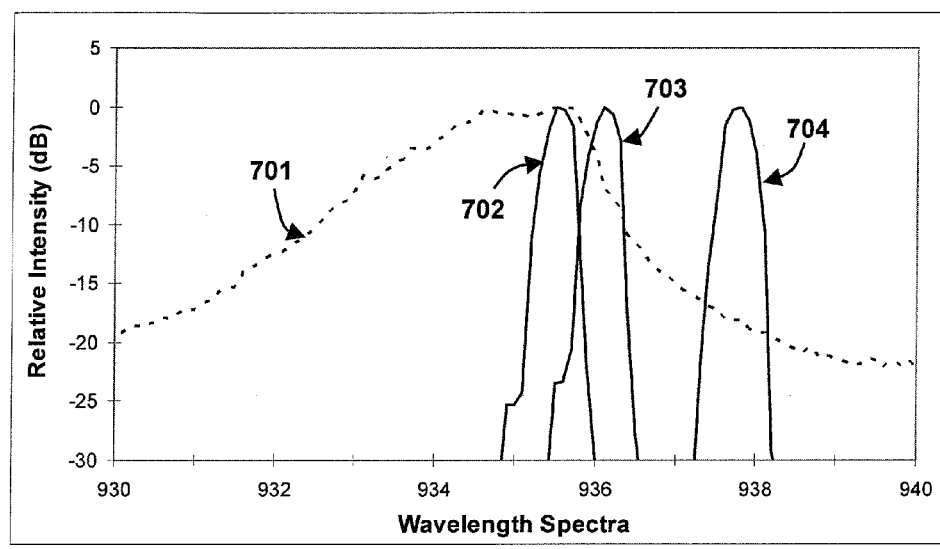

Example spectral data of laser diodes with the same dimensions (1.5 mm long, 0.1 mm aperture) and from the same wafer are compared in FIG. 7 to illustrate the wavelength stabilizing effect of a partial-DFB grating.

Figure 8:
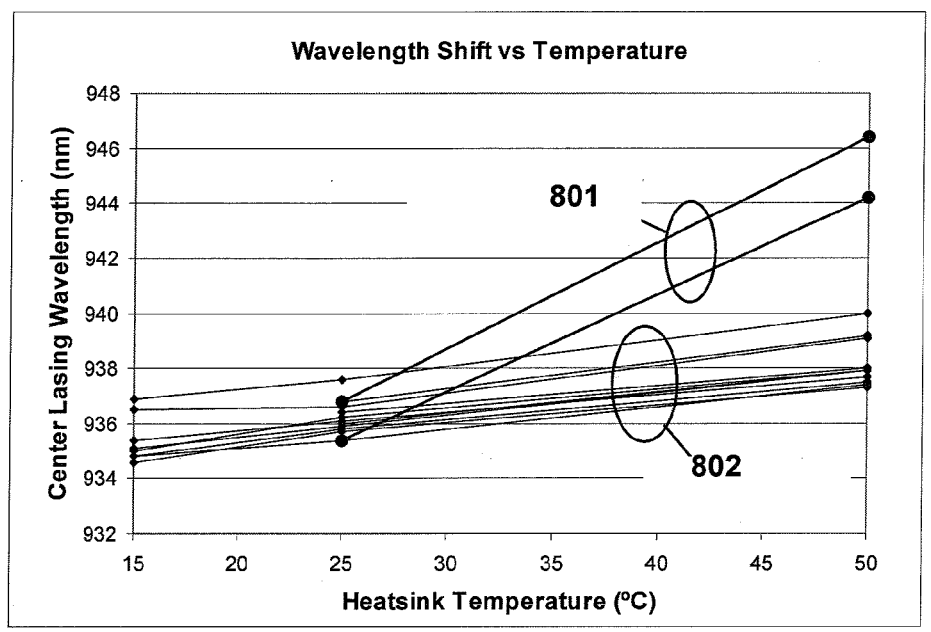

The lasing wavelength dependence on temperature is plotted in FIG. 8 for a number of diodes both with and without a partial-DFB grating.

Figure 9:
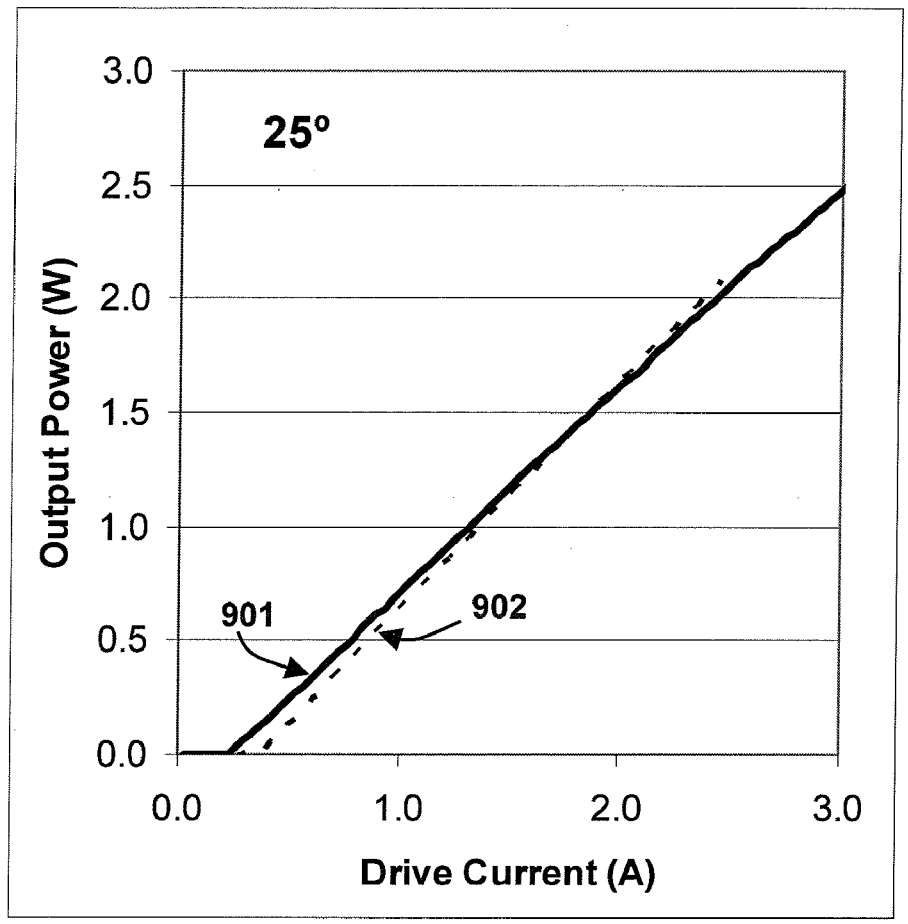

The drive current characteristics of two laser diodes, one with, and one without a partial-DFB grating are plotted in FIG. 9.

Figure 10:
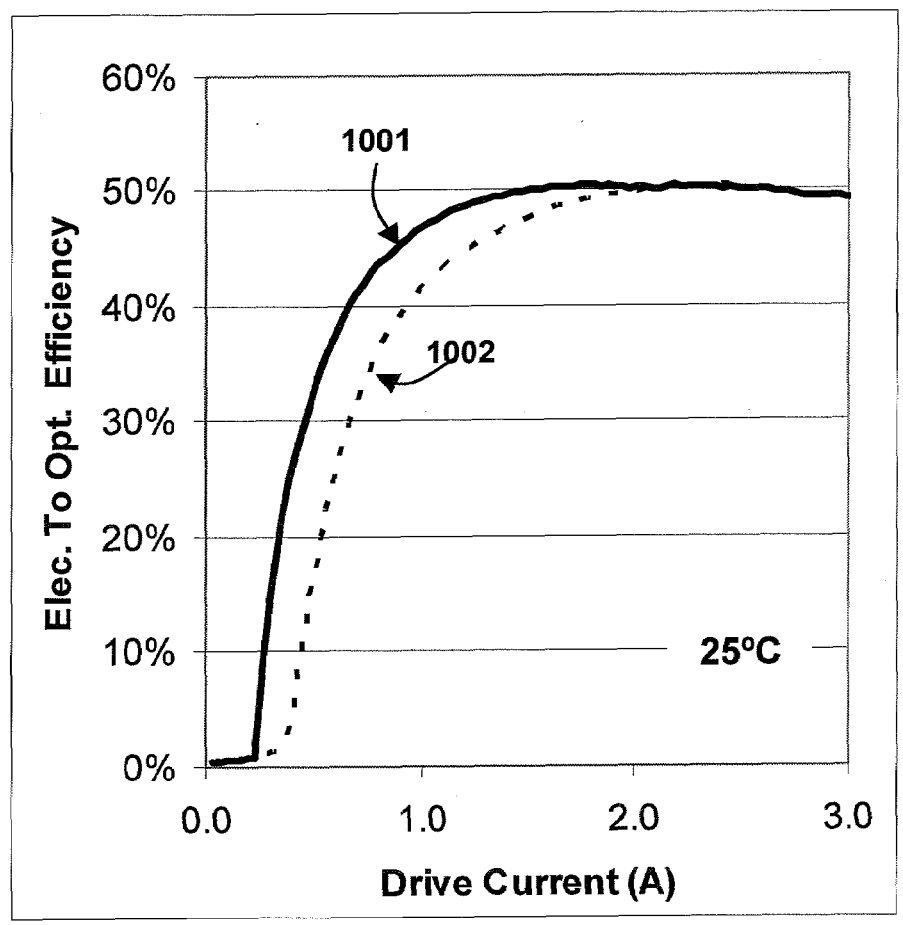

The electrical to optical efficiency characteristics of two laser dicdes, one with, and one without a partial-DFB grating are plotted in FIG. 10.

DETAILED DESCRIPTION OF PREFERRED EMBODIMENTS

The present invention describes a broad area semiconductor laser structure, which is capable of operating at high output power levels with a stabilized emission wavelength. To enable efficient operation, the emission wavelength is stabilized by a grating with a low coupling coefficient in a laser cavity thereby incurring low excessive optical loss.

Figure 1A:
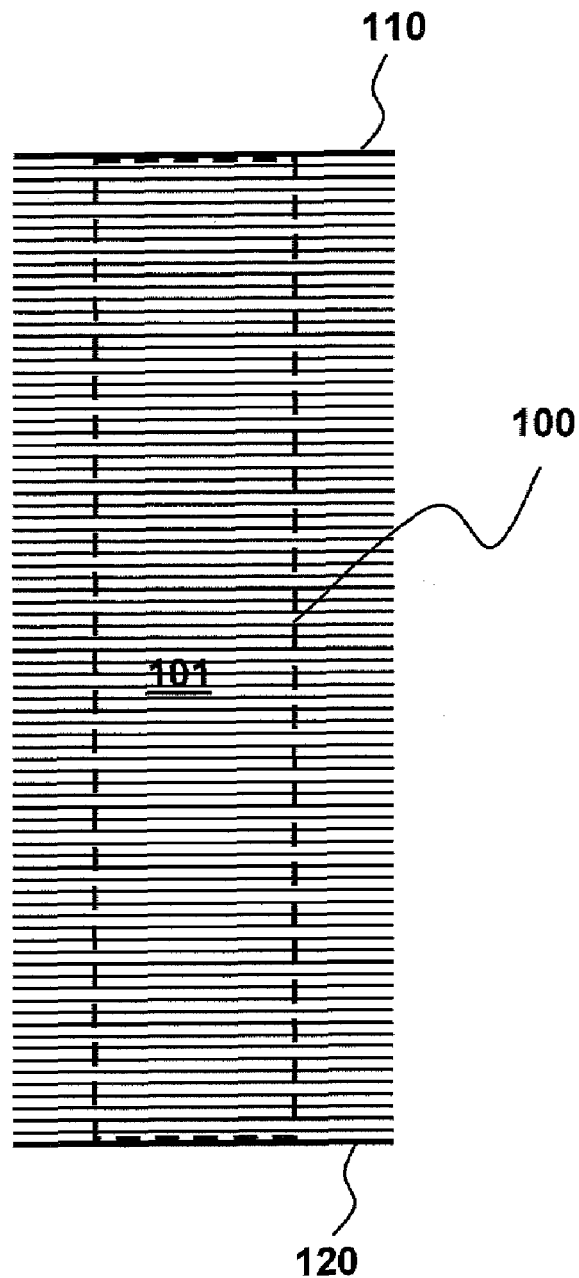

In a first embodiment, a full DFB structure comprises a grating 101 with low coupling coefficient uniformly overlapping the current injection area 100 indicated by the dashed line, as illustrated in a top view in FIG. 1a. The front facet 110 and rear facet 120 may be AR and HR coated, respectively, for high efficiency.

One difficulty with this structure is achieving a sufficiently low coupling coefficient. To overcome this difficulty, the grating can be divided into in partial regions to reduce the total coupling while achieving wavelength stabilization.

In accordance with another aspect of the invention, a broad area semiconductor laser diode has a partial grating inside the resonant cavity in order to restrict laser oscillation to only a few longitudinal modes as determined by the spectral bandwidth of the partial grating reflectivity. A partial grating does not completely overlap the current injection area.

An advantage of the partial grating is that the laser oscillates in a narrow bandwidth while the wavelength drift with temperature is reduced. In addition, the wall plug efficiency of the laser diode with the partial grating is substantially the same as a similar laser diode without the partial grating. The disclosure shows several different embodiments for incorporating the partial grating into a resonant cavity.

The invention provides several means for controlling the optical coupling of light between the partial grating and the modes of the laser cavity in order to minimize the losses incurred by placing a partial grating inside the resonant cavity. By this means, the laser efficiency is maintained.

Figure 1B:
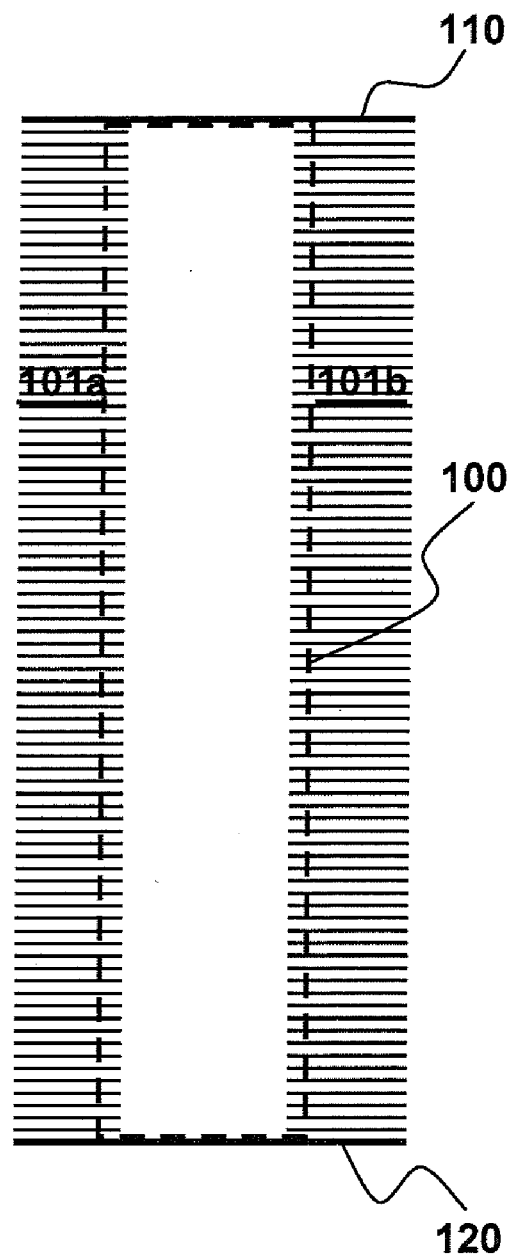

A second embodiment incorporating a partial grating with lateral segments is shown in top view in FIG. 1b. Two grating segments 101a, 101b extending from the front facet 110 to the rear facet 120 overlap the edges of the current injection area 100 with sufficient overlap area to give a desired reduction of total coupling coefficient.

In the case of an axially segmented partial grating, an aggregate grating length of all the segments is less than the cavity length.

Further embodiments comprising an axially segmented grating and different facet reflectivity configurations are disclosed, although this list should not be considered as exhaustive: a) a front facet DBR or partial DFB structure with low anti-reflection (AR) coating, b) a rear facet DBR or partial DFB with AR coating, and c) a rear facet DBR or partial DFB with high reflectivity (HR) coating A DFB section differs from a DBR section in that it is electrically pumped.

Figure 1C:
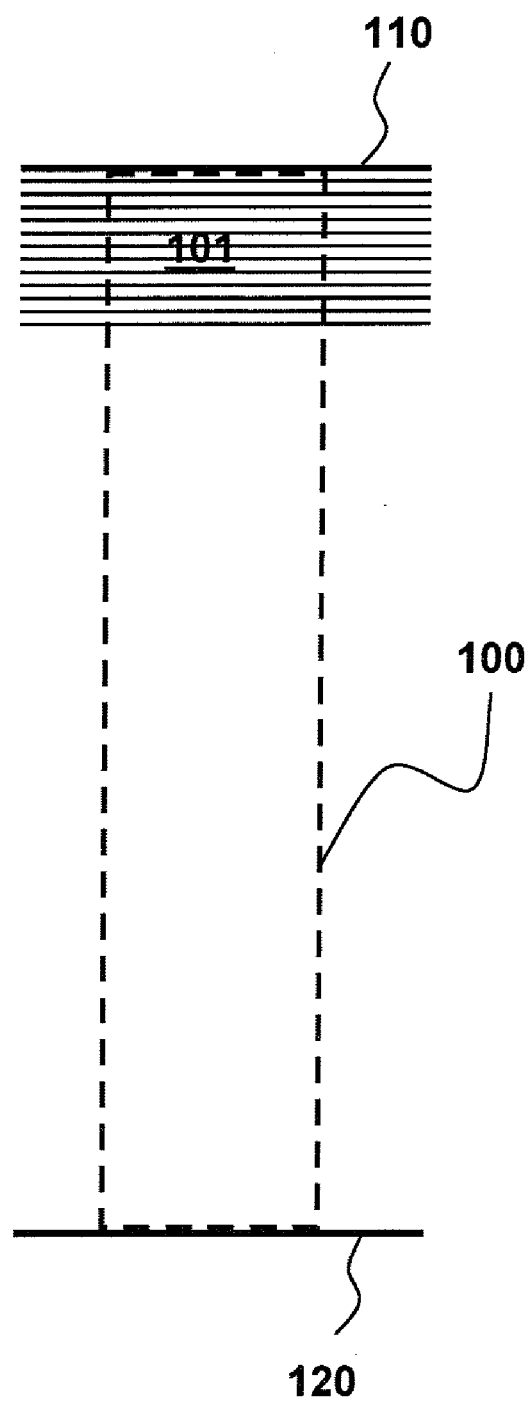
Figure 1D:
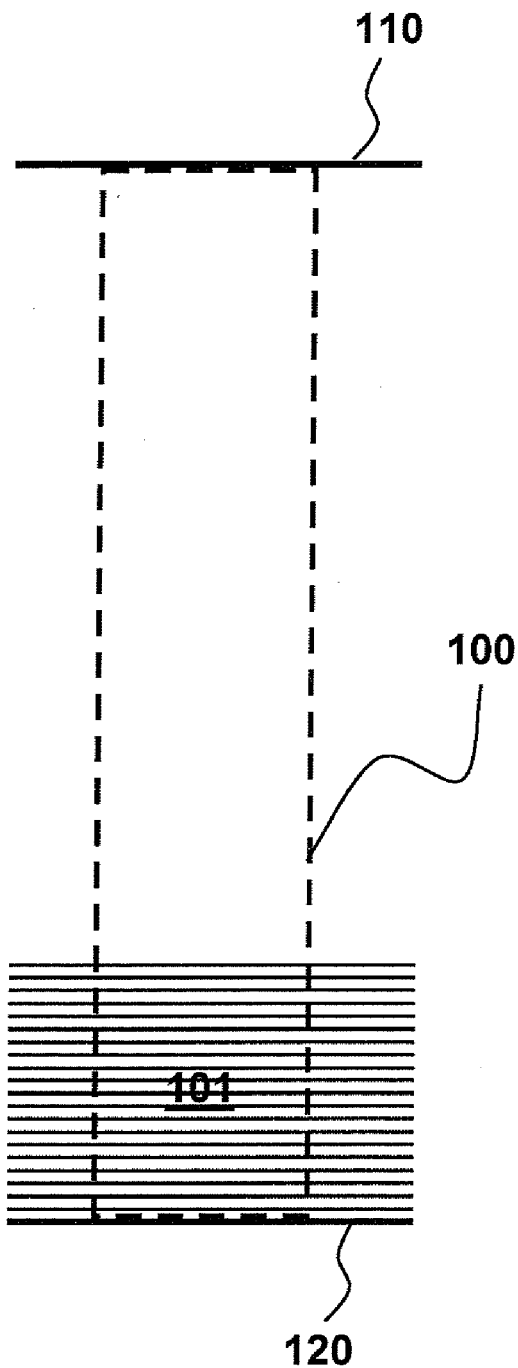
Figure 1E:
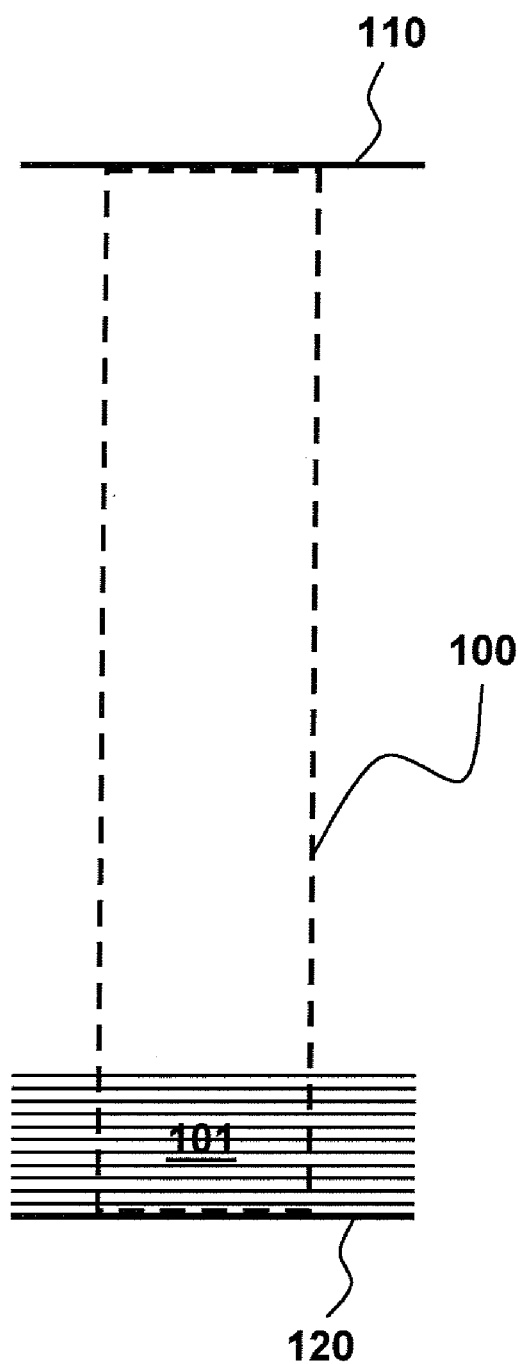

Top views of these structures are shown schematically in FIGS. 1c through 1e.

FIG. 1c shows a third embodiment of a broad area laser with a short front facet partial DFB or DBR grating 101, where the field reflectivity of the AR coating of the front facet 110 is reduced from typical values of r≈10%, to very low values, r<2%. Generally the rear facet 120 is coated to have a high reflectivity. Current is injected into the laser over the current injection area 100 indicated by the dashed line.

Figure 2A:
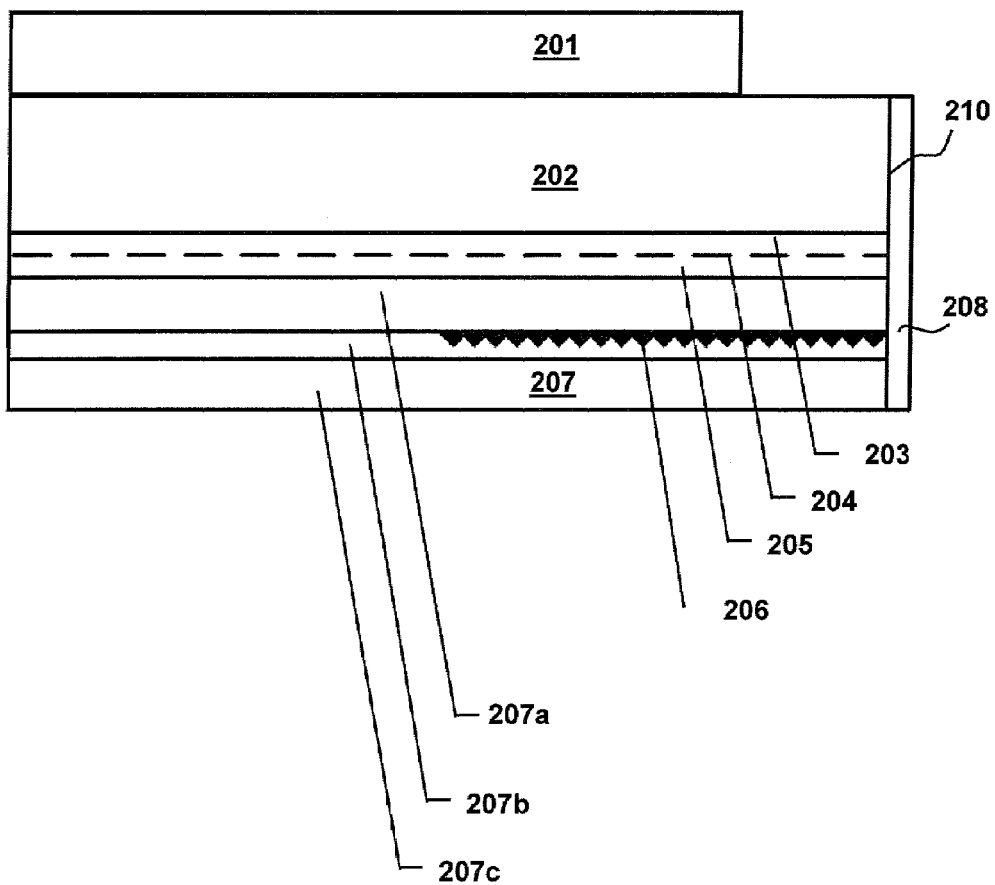
FIGS. 2a through 2c are exemplary cross-sections of a partial-DFB structure placed on the output facet side of the laser diode cavity. Depending on the design, the grating can be on the n-side (FIG. 2a) or p-side (FIG. 2b) of the active region at a variety of distances away from the active layer and guide layers.

A cross-section of such a structure is illustrated in FIG. 2a. In this case the grating 206 is on the n-side of the active layer 204. Above and below the active layer 204 represented by the dashed line are two guide layers doped p-type 203 and n-type 205 respectively, in turn sandwiched between p-type cladding layer 202 and n-type cladding layers 207a through 207c, respectively. Electrical current is introduced into the current injection area through a metal electrode 201 which makes contact to the p-type side of the laser. The other electrode makes contact to the n-type side through the substrate (not shown). Only the front facet 210 is shown coated with the AR coating 208

Figure 2B:
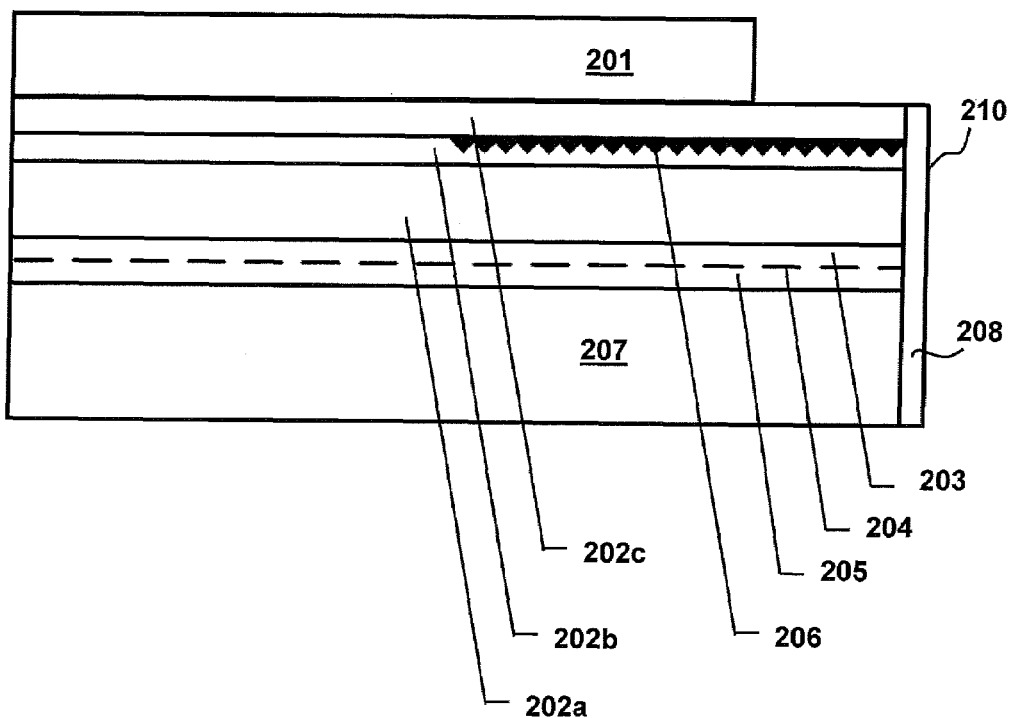

FIG. 2b displays a cross-section of an alternative embodiment in which the partial grating 206 is on the p-side of the active layer 204 represented by the dashed line. Above and below the active layer 204 are two guide layers doped p-type 203 and n-type 205 respectively, in turn sandwiched between p-type cladding layers 202a through 202c and n-type cladding layer 207, respectively. As before, electrical current is introduced into the current injection area through a metal electrode 201 which makes contact to the p-type side of the laser. The other electrode makes contact to the n-type side through the substrate (not shown) Only the front facet 210 is shown coated with the AR coating 208.

Figure 2C:
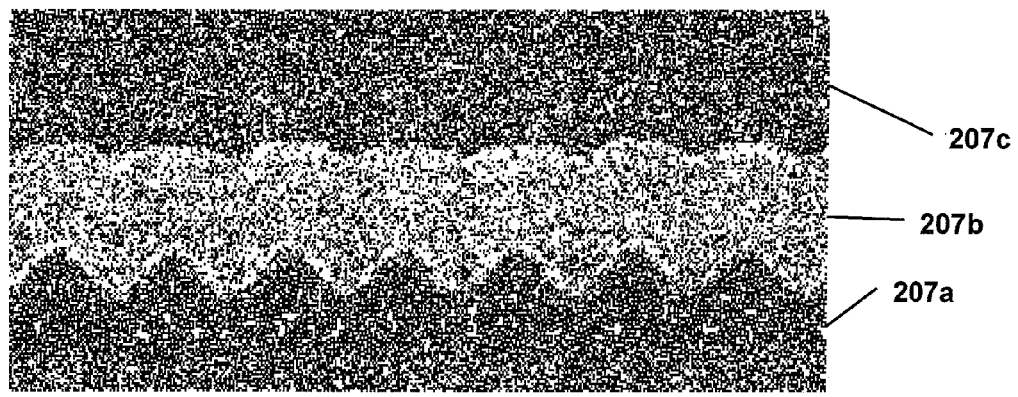

A scanning electron micrograph is given in FIG. 2c of an actual first-order grating for emitting a 935 nm wavelength, executed in the AlGaAs system used to verify this invention. Visible are n-type cladding layers 207a through 207c. The grating (206, above) is incorporated between cladding layers 207a and 207c. The invention is not limited to first-order grating, 935 nm wavelength or AlGaAs gratings but is used here as a working example of the invention.

Figure 3:
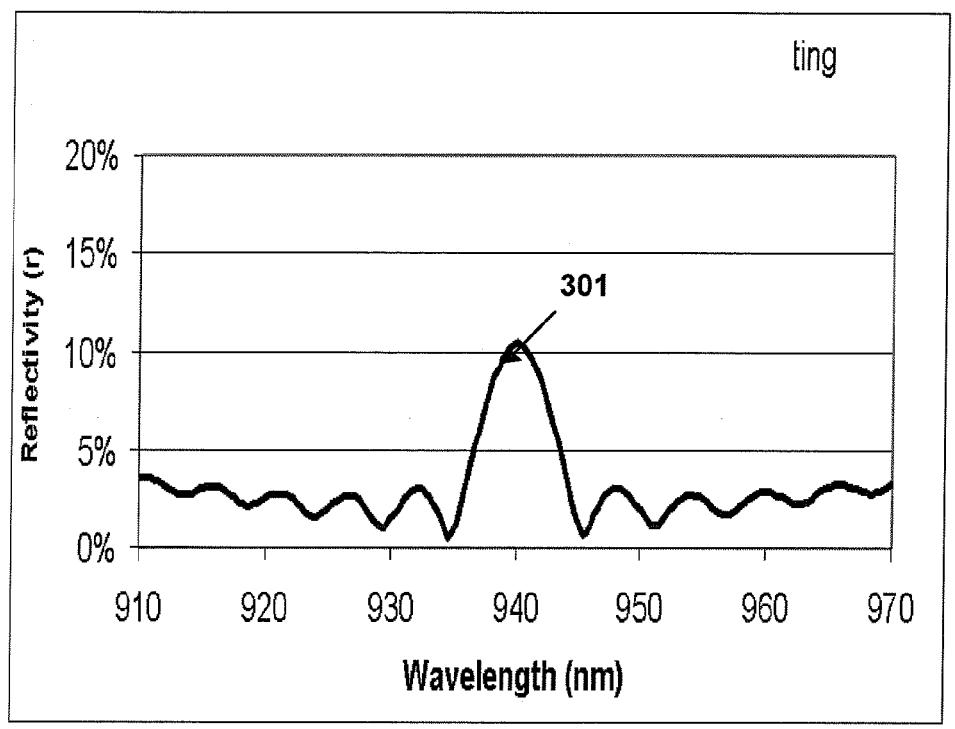
FIG. 3 is a plot of the reflectivity vs. wavelength characteristic on the output side of an exemplary front-facet partial-DFB structure.

An example of calculated front facet reflectivity vs. wavelength characteristic 301 is shown in FIG. 3 for a partial-DFB whose front-facet (FF) is coated with a two layer AR coating. The grating has a typical strength and a 30 micron length that overlaps with the current injection area. In this example the wavelength selectivity is approximately 940±3 nm.

FIG. 1d shows a fourth embodiment of a broad area laser with a long rear facet partial DFB or DBR grating 101, where the field reflectivity of the coating of the rear facet 120 is reduced from typical HR values of r≈99%, to lower values more typical of AR coatings, r<10%. Current is injected into the laser over the current injection area 100. The front facet 110 is also AR coated.

Figure 4:
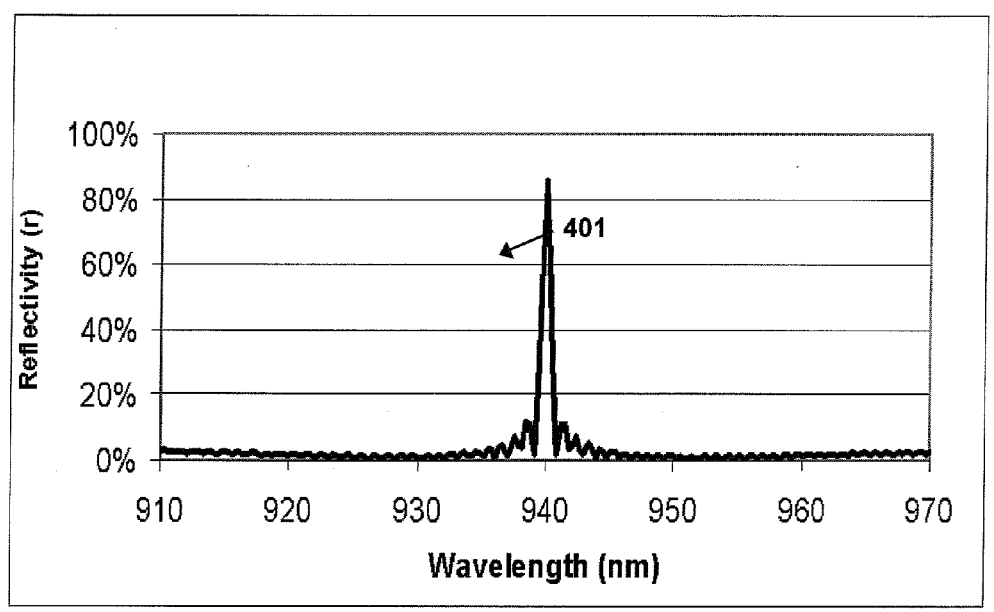
FIG. 4 is a plot of the reflectivity vs. wavelength characteristic on the rear of an exemplary rear facet (RF) partial-DFB with AR structure.

An example of calculated front facet reflectivity vs. wavelength characteristic 401 is shown in FIG. 4 for a partial-DFB whose front-facet (FF) is coated with an AR coating. The grating has a typical strength and a 300 micron length that overlaps with the current injected area.

In a fifth embodiment appearing in FIG. 1e a broad area laser has a short rear facet partial DFB or DBR grating 101, where the field reflectivity of the coating of the rear facet 120 is reduced from typical HR values of r≈99%, to medium values, r~50%. Current is injected into the laser over the current injection area 100. The front facet 110 is also AR coated. In this structure, the optical phase of reflections from the partial DFB or DBR grating and the rear facet cannot be controlled in practice. It can affect the wavelength selectivity but with the multi-mode operation of a broad area laser, this can still result in a useful manufacturing yield of wavelength stabilized lasers.

Figure 5:
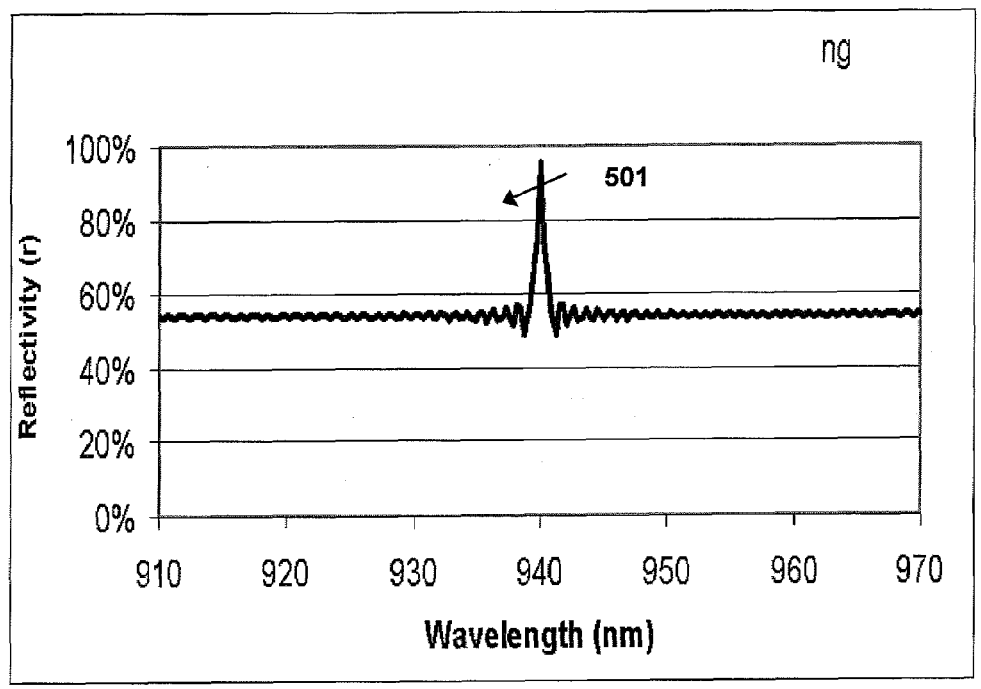
FIG. 5 is a plot of the reflectivity vs. wavelength on the rear of an exemplary RF partial-DFB structure.

FIG. 5 depicts the calculated spectral characteristic 501 of a rear facet partial DFB grating which has a typical strength and a 300 micron length overlapping with the current injection area.

Figure 1F:
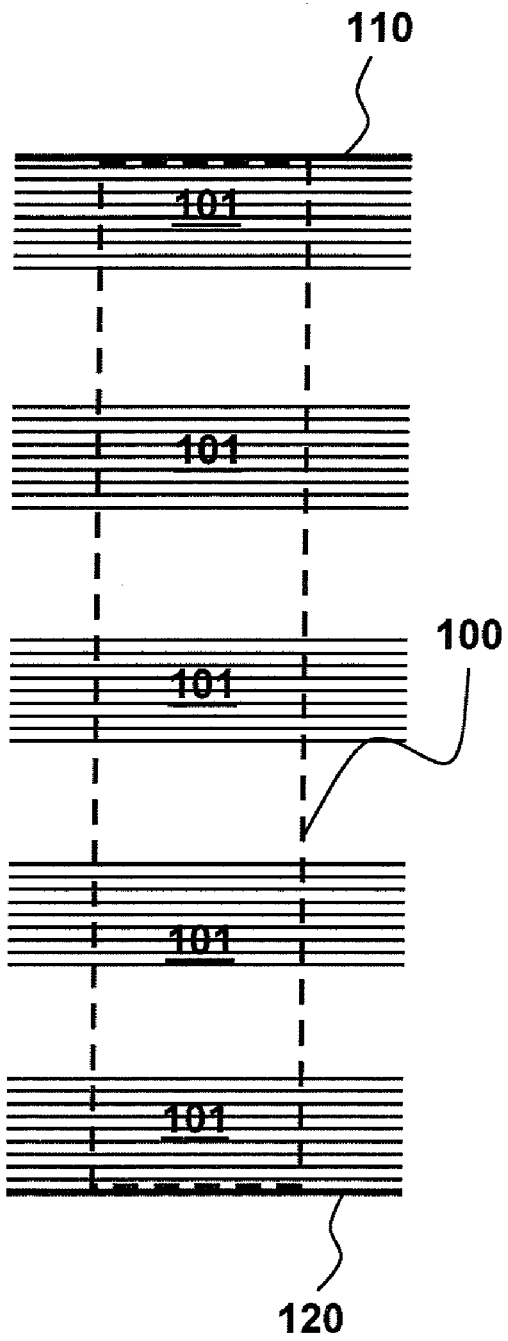

A sixth embodiment comprising a DFB grating structure with multiple axial segments is shown in FIG. 1f. Several grating segments 101 are placed uniformly throughout the length of the current injected area 100 through which an electric current is injected to operate the laser. The front facet 110 is AR coated and the rear facet 120 HR coated for high efficiency.

Figure 6A:
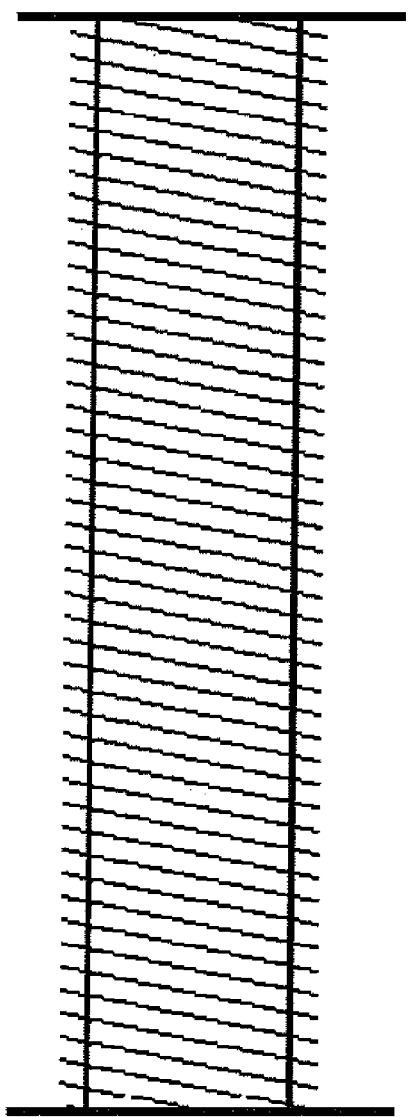
FIGS. 6a through 6c are schematic top views (not to scale) of how the grating can be angled (FIG. 6a), chirped (FIG. 6b) or modified in shape (FIG. 6c) to reduce the effects of phase mismatch between the grating and the facets.
Figure 6B:
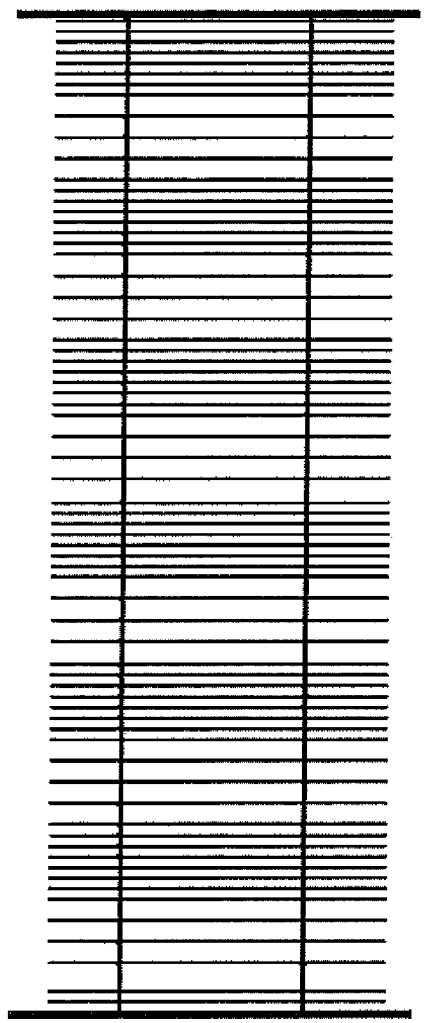
Figure 6C:
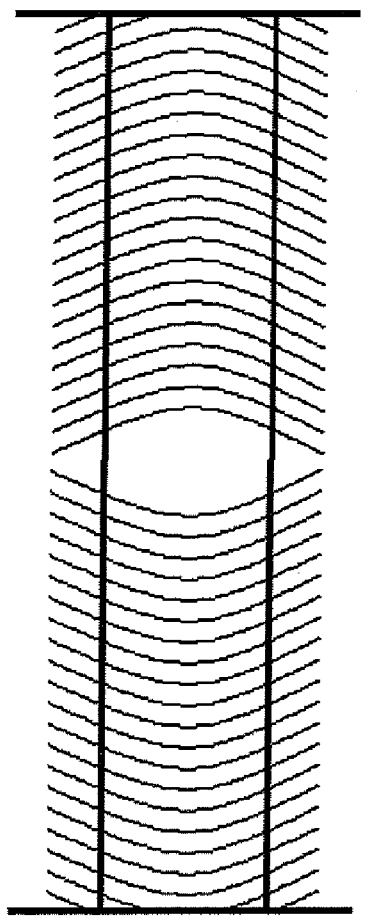

Another difficulty may arise due to phase mismatch between a grating segment and a facet. Angling the grating (FIG. 6a), changing the shape of the grating (FIG. 6c) and chirping or varying the pitch of the grating could be applied to reduce this effect.

An example of how this invention has been reduced to practice is shown in FIGS. 7 to 10.

FIG. 7 shows spectral data traces comparing laser diodes having the same dimensions (1.5 mm long, 0.1 mm wide aperture) and from the same wafer but one with a partial-DFB grating to stabilize the wavelength and one without a grating. Without the grating the laser emission at 25° C. has a spectral response 701 with a width greater than 2 nm full-width-at-half-maximum (FWHM), which is typical for broad area multimode laser diodes. However with the grating, the FWHM is reduced to less than 0.5 nm. This narrower width can be used to improve the pumping efficiency for a variety of pumped materials. The stabilizing effect of the grating on the laser emission is demonstrated by the reduced shift in the lasing characteristics 702, 703 and 704 at temperatures of 15° C., 25° C. and 50° C., respectively. Over this temperature range, the shift is approximately the same as the FWHM of the emission from the laser diode without the grating.

FIG. 8 shows the variation of lasing wavelength with temperature for a batch of diodes both with and without a partial-DFB grating. Without the grating, the wavelength shift with temperature exceeds 0.3 nm/° C. (801), which corresponds to the shift of active region material gain peak. By including the grating, the wavelength shift with temperature is limited to below 0.1 nm/° C. (802), which corresponds to the shift of the AlGaAs grating effective index.

FIGS. 9 and 10 highlight the main benefits of this invention. Because the grating is designed have low optical loss in the laser cavity, the efficiency of a laser with the grating is almost identical to the laser without the grating, as evidenced by similar optical power output characteristics and total efficiency. In FIG. 9, the optical power versus current characteristic at 25° C. is compared for the laser with grating 901 and the laser without grating 902. The electrical to optical efficiency is plotted in FIG. 10, also at 25° C., for the laser with grating 1001 and the laser without grating 1002.

It should be clear that the laser with a grating has good linearity demonstrating that multiple modes are still supported, as well as a slightly lower threshold current and slope efficiency because the grating introduces a slightly higher reflectivity than the facet coating on the laser without the grating.

In summary, a key aspect of this invention is the application of a low coupling coefficient grating having low optical loss to stabilize wavelength of a laser without the necessity for achieving single-frequency operation, which could introduce excess optical loss and possibly cause undesirable effects due to mode hops.

What is claimed is:

1. A semiconductor pump laser comprising:
    a semiconductor chip having a first facet at one end thereof and a second facet at the opposite end thereof;
    an optical waveguide between the first facet and the second facet, comprising an active layer sandwiched between a n-type layer and a p-type layer to form a diode, wherein the optical waveguide and the first and second facets form an optical cavity capable of supporting multiple lasing modes, wherein the cavity has a cavity length that is between about 800 micron and 3000 micron;

a single metal electrode in contact with a p-side current injection area extending along the optical waveguide for pumping a drive current into a pumped area of the active layer;

a grating extending from the first facet to the second facet within the waveguide to provide distributed feedback for a plurality of adjacent lasing modes, wherein the grating is coupled to the active layer at a total coupling coefficient—cavity length product not exceeding 0.2.

2. The semiconductor pump laser as defined in claim 1 wherein the grating partially overlaps the pumped area.

3. The semiconductor pump laser as defined in claim 1 wherein the grating is divided into more than one non-contiguous segment.

4. The semiconductor pump laser as defined in claim 1 wherein the grating is a first order grating.

5. The semiconductor pump laser as defined in claim 1 wherein the cavity is made of compound semiconductor.

6. The semiconductor pump laser as defined in claim 5 wherein the compound semiconductor is a combination of one or more of aluminum, gallium, and arsenic.

7. The semiconductor pump laser as defined in claim 6 wherein the emission wavelength is between about 790 nm and 1000 nm.

8. The semiconductor pump laser as defined in claim 1 wherein the grating comprises corrugations that have a uniform pitch.

9. The semiconductor pump laser as defined in claim 1 wherein the grating comprises corrugations that have a non-uniform pitch.

10. The semiconductor pump laser as defined in claim 1 wherein the grating comprises corrugations that are curved.

* * * * *